US006429502B1

(12) United States Patent
Librizzi et al.

(10) Patent No.: US 6,429,502 B1
(45) Date of Patent: Aug. 6, 2002

(54) MULTI-CHAMBERED TRENCH ISOLATED GUARD RING REGION FOR PROVIDING RF ISOLATION

(75) Inventors: Michael Librizzi; Christopher D. Hull, both of San Diego, CA (US)

(73) Assignee: Silicon Wave, Inc., San Diego, CA (US)

( * ) Notice: Subject to any disclaimer, the term of this patent is extended or adjusted under 35 U.S.C. 154(b) by 0 days.

(21) Appl. No.: 09/643,575

(22) Filed: Aug. 22, 2000

(51) Int. Cl.[7] .................................................. H01L 29/00

(52) U.S. Cl. ....................................................... 257/510

(58) Field of Search ................................. 257/510, 514, 257/515, 396, 397, 605, 506, 520; 438/221, 315, 361, 244, 386, 400, 570

(56) References Cited

U.S. PATENT DOCUMENTS

| | | | |
|---|---|---|---|
| 5,144,308 A | 9/1992 | Norsworthy | 341/131 |
| 5,279,978 A | 1/1994 | See et al. | 437/34 |
| 5,294,823 A | 3/1994 | Eklund et al. | 257/370 |
| 5,424,739 A | 6/1995 | Norsworthy et al. | 341/143 |
| 5,430,317 A | 7/1995 | Onai et al. | 257/347 |
| 5,449,953 A | 9/1995 | Nathanson et al. | 257/728 |
| 5,498,885 A | 3/1996 | Deen et al. | 257/139 |
| 5,578,970 A | 11/1996 | Nguyen et al. | 331/75 |
| 5,619,069 A | 4/1997 | Ohta et al. | 257/692 |
| 5,643,805 A | 7/1997 | Ohta et al. | 437/31 |
| 5,644,157 A | 7/1997 | Iida et al. | 257/521 |
| 5,661,329 A | 8/1997 | Hiromoto et al. | 257/510 |
| 5,684,482 A | 11/1997 | Galton | 341/144 |
| 5,745,061 A | 4/1998 | Norworthy et al. | 341/131 |
| 5,773,340 A | 6/1998 | Kumauchi et al. | 438/234 |
| 5,841,169 A | * 11/1998 | Beasom | 257/355 |
| 5,962,908 A | * 10/1999 | Beasom et al. | 257/506 |

FOREIGN PATENT DOCUMENTS

| | | | |
|---|---|---|---|
| JP | 6053422 A | 2/1994 | H01L/27/06 |
| JP | 8241999 | 9/1996 | H01L/29/786 |
| WO | WO9702602 | 1/1997 | H01L/27/12 |

OTHER PUBLICATIONS

Bluetooth Special Interest Group website http://www.bluetooth.com; "Bluetooth–Document Page", including "Technology Overview, Radio", "Baseband", "Link Management", "Software Framework", "PC General", "Telephone", "Others"; Date Unknown; pp. 1–10.

Durec, Jeff, "An Integrated Silicon Bipolar Receiver Subsystem for 900–Mhz ISM Band Applications", IEEE Journal of Solid State Circuits, 33(9):1352–1372 (Sep., 1998).

(List continued on next page.)

Primary Examiner—Tom Thomas
Assistant Examiner—Samuel A. Grebremaria
(74) Attorney, Agent, or Firm—Jaquez & Associates; Martin J. Jaquez, Esq.; Allan Y. Lee, Esq.

(57) ABSTRACT

A novel trench isolated guard ring region for providing RF isolation is disclosed. The semiconductor integrated circuit (IC) device of the present invention comprises a substrate, an insulating layer formed on the substrate, a buried layer formed on the insulating layer, and an epitaxial layer of a first conductivity type formed on the buried layer. A first isolation trench is formed in the epitaxial layer and the buried layer that extends to the insulating layer and that surrounds a first selected surface area of the epitaxial layer. A second isolation trench is formed in the epitaxial layer and the buried layer that extends to the insulating layer and that surrounds the first isolation trench and defines a guard ring region between itself and the first isolation trench. A plurality of isolation chambers is formed within the first and second isolation trenches. A collector is implanted into the epitaxial layer in the guard ring region. A contact is made to the collector, and a conductor connects the contact to a ground node.

28 Claims, 13 Drawing Sheets

OTHER PUBLICATIONS

Hashimoto, et al., "A 6–$\mu$ m² bipolar transistor using 0.25–$\mu$ m process technology for high–speed applications", IEEE Proceedings or the Bipolar BiCMOS Circuits and Technology Meeting, 152–155, Sep. 1998.

IEEE Personal Communications, "Figure 3. A Wireless–enhanced scenario for PCCAs", Dec. 1998, p. 1.

Kikuchi, et al., "A 0.35$\mu$m ECL–CMOS Process Technology on SOI for 1ns Mega–bits SRAM s with 40ps Gate Array", International Electronic Devices Meeting Technical Digest, 95:923–926 (Dec. 1995).

Sze, S.M., "Semiconductor Devices, Physics and Technology", New Jersey, John Wiley & Sons, 1985, pp 468–472, ISBN 0–471–87424–8.

U. S. application No. 09/216,040, Brown et al., filed Dec. 18, 1998.

U. S. application No. 09/272,822, Seefeldt, filed Mar. 19, 1999.

U. S. application No. 09/305,330, Brown et al., filed May 4, 1999.

* cited by examiner

MULTI-CHAMBERED TRENCH ISOLATED GUARD RING REGION FOR PROVIDING RF ISOLATION

CROSS-REFERENCE TO RELATED APPLICATION

This application is related to U.S. application Ser. No. 09/255,747, filed Feb. 23, 1999, entitled "Trench Isolated Guard Ring Region For Providing RF Isolation", hereby incorporated by reference herein.

BACKGROUND OF THE INVENTION

1. Field of the Invention

This invention relates to isolation techniques in semiconductor integrated circuits (ICs), and more particularly, to isolation techniques in silicon-on-insulator integrated circuits and isolation of radio frequency (RF) signals in silicon-on-insulator integrated circuits.

2. Description of Related Art

In semiconductor electronics, the general trend is to the production of integrated circuits having smaller and smaller form factors with improved performance and lower cost. In order to reduce form factors, more circuitry must be packed into less wafer real estate. As inter-device spacing shrinks, adjacent elements of the circuitry begin to interact with each other, reducing their performance. The basic measurement parameter that characterizes this effect is referred to as isolation. High isolation, and in particular, high RF isolation, implies that devices can be spaced closer together, and die size can be reduced. Minimum size in turn implies placement in smaller packaging and less space used on the application PCB Board. Also, because wafer processing costs are nearly independent of chip size, smaller circuits imply more die per wafer and thus a lower per die cost.

Isolation is parameter that is particularly important for analog integrated circuits (ICs). For example, isolation is important for ICs used in wireless communications applications. In general, wireless communications devices use high-frequency signals: 900 MHz to 1900 MHz for cellular phones and higher (up to 6 GHz) for other systems, such as wireless LANs. The well-known Bluetooth standard calls for operation in the unlicensed ISM band at 2.4 GHz. Signals at such frequencies, i.e., high radio frequencies (RF), are difficult to generate and control. They also have a tendency to interfere with each other, as they are easily coupled by parasitic properties present in all electronic components, including ICs. In ICs, many of the undesirable parasitic effects result from the conductive silicon substrate on which the circuits are fabricated. Poor isolation in a receiver, for example, can cause a portion of the local oscillator (LO) signal to appear at the output of the receiver and effectively be transmitted at the antenna. Wireless regulatory authorities limit the amount of spurious signal that can be radiated by the receiver, so limiting the amount of LO radiation is necessary to meet these specifications.

One type of semiconductor technology that is finding more use in bipolar applications is Silicon-On-Insulator (SOI) designs. With SOI, an insulating layer separates circuit devices from a solid silicon substrate. An example of one particular SOI technology is the bonded SOI BiCMOS process technology that is available from Hitachi Ltd. of Japan, and specifically, the Hitachi Ltd. Device Development Center in Tokyo, Japan. This SOI BiCMOS process technology is also described in U.S. Pat. No. 5,661,329 entitled "Semiconductor Integrated Circuit Device Including An Improved Separating Groove Arrangement", U.S. Pat. No. 5,773,340 entitled "Method of Manufacturing a BIMIS", and U.S. Pat. No. 5,430,317 entitled "Semiconductor Device", the complete disclosures of which are all hereby fully incorporated into the present application by reference for their teachings on SOI technologies.

Furthermore, this SOI BiCMOS process technology is also described in the paper entitled "A 0.35 um ECL-CMOS Process Technology on SOI for Ins Mega-bits SRAM's with 40 ps Gate Array" by T. Kikuchi, Y. Onishi, T. Hashimoto, E. Yoshida, H. Yamaguchi, S. Wada, N. Tamba, K. Watanabe, Y. Tamaki, and T. Ikeda of the Hitachi Ltd. Device Development Center, Tokyo, Japan, published in the IEDM Technical Digest, IEDM 95-923, in connection with the International Electron Devices Meeting, Dec. 10–13, 1995, 0-7803-2700-4, 1995 IEEE, the complete disclosure of which is hereby fully incorporated into the present application by reference. An SOI process technology is also described in the paper entitled "A 6 um2 bipolar transistor using 0.25-um process technology for high-speed applications" by T. Hashimoto, T. Kikuchi, K. Watanabe, S. Wada, Y. Tamaki, M. Kondo, N. Natsuaki, and N. Owada of the Hitachi Ltd. Device Development Center, Tokyo, Japan, published in IEEE BCTM 9.1, 0-7803-4497-9/98, 1998 IEEE, the complete disclosure of which is hereby fully incorporated into the present application by reference for its teachings on SOI technology.

Two types of substrate isolation techniques have heretofore been employed in SOI (such as the bonded SOI BiCMOS process technology available from Hitachi Ltd.). The first uses guard rings, and the second uses $SiO_2$ trench isolation. Guard rings are substrate contacts that enclose the area to be isolated. Dielectric trench isolation structures provide lateral barriers between circuit elements. These techniques isolate signals and minimize the undesired coupling that would otherwise limit performance for closely spaced adjacent circuit elements.

U.S. Pat. No. 5,661,329 (hereinafter '329) discloses an element separating groove arrangement formed to surround active regions to be formed with a semiconductor element. One disadvantage of this separating groove arrangement is that external RF power can still pass through the separating grooves to the active region. Specifically, the separating groove arrangement described in the '329 patent appears to be intended primarily for yield improvement and not for RF isolation. The '329 patent does not appear to address the problem of RF isolation and appears to show no intent to terminate electric fields created by RF power.

U.S. Pat. No. 5,644,157 (hereinafter '157) describes a polysilicon trench layered within a silicon oxide film formed to surround active regions to be formed with a semiconductor element. One disadvantage of utilizing a solid silicon oxide film is that external RF power or energy can avoid the polysilicon trench and pass through the solid silicon oxide film into the active regions. The '157 patent improves RF isolation on SOI technology, however, RF power can still penetrate into the active regions.

Thus, there is a need for an apparatus and method that provides improved RF isolation on SOI process technology.

SUMMARY OF THE INVENTION

The present invention provides a semiconductor integrated circuit (IC) device that includes a substrate, an insulating layer formed on the substrate, and additional semiconductor layers formed on the insulating layer. A first isolation trench is formed in the additional semiconductor layers that extends to the insulating layer and that surrounds a first selected surface area of the additional semiconductor layers. A second isolation trench is formed in the additional semiconductor layers that extends to the insulating layer and that surrounds the first isolation trench and defines a guard ring region between itself and the first isolation trench. The first and second isolation trenches comprise isolation chambers that are smaller in size relative to the size of the isolation trenches. The isolation chambers are configured in several different manners. A ground conductor couples the guard ring region to a ground node.

The present invention also provides a semiconductor integrated circuit (IC) device that includes a substrate, an insulating layer formed on the substrate, a buried layer formed on the insulating layer, and an epitaxial layer of a first conductivity type formed on the buried layer. A first isolation trench comprising multiple isolation chambers is formed in the epitaxial layer and the buried layer that extends to the insulating layer and that surrounds a first selected surface area of the epitaxial layer. A second isolation trench comprising multiple isolation chambers is formed in the epitaxial layer and the buried layer that extends to the insulating layer and that surrounds the first isolation trench and defines a guard ring region between itself and the first isolation trench. A collector is implanted into the epitaxial layer in the guard ring region. A contact is made to the collector, and a conductor connects the contact to a ground node.

The present invention also provides a semiconductor integrated circuit (IC) device that includes a silicon-on-insulator (SOI) substrate having an insulating layer formed on a substrate. A guard ring is formed on a surface of the insulating layer that surrounds a first selected surface area of the insulating layer. The guard ring has a lower buried layer region in contact with the surface of the insulating layer and an upper collector region. First and second isolation trenches comprising multiple isolation chambers are formed substantially perpendicular to and in contact with the surface of the insulating layer which sandwich and isolate the guard ring therebetween. A contact is made to the upper collector region of the guard ring, and a conductor connects the contact to a ground node.

The present invention also provides a method of forming a semiconductor integrated circuit (IC) device. The method includes: forming a silicon-on-insulator (SOI) substrate having an insulating layer formed on a substrate; forming a buried layer on the insulating layer; forming an epitaxial layer of a first conductivity type on the buried layer; forming a first isolation trench in the epitaxial layer and the buried layer that extends to the insulating layer and that surrounds a first selected surface area of the epitaxial layer; forming a plurality of isolation chambers within the first isolation trench; forming a second isolation trench in the epitaxial layer and the buried layer that extends to the insulating layer and that surrounds the first isolation trench and defines a guard ring region between itself and the first isolation trench; forming a plurality of isolation chambers within the second isolation trench; implanting a collector into the epitaxial layer in the guard ring region; establishing a contact to the collector; and connecting the contact to a ground node.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings indicate like elements.

DETAILED DESCRIPTION OF THE INVENTION

Throughout this description, the preferred embodiment and examples shown should be considered as exemplars, rather than as limitations on the present invention.

One purpose of the present invention is to improve device-to-device isolation (such as RF isolation) on a single Silicon-On-Insulator (SOI) substrate. Such isolation allows integration of, for example, numerous RF components that operate at high power levels on the same silicon substrate with low RF leakage between components. For example, greater than 80 dB of isolation is possible at 2 GHz for 200 um of device separation using the teachings of the present invention.

Figure 1:
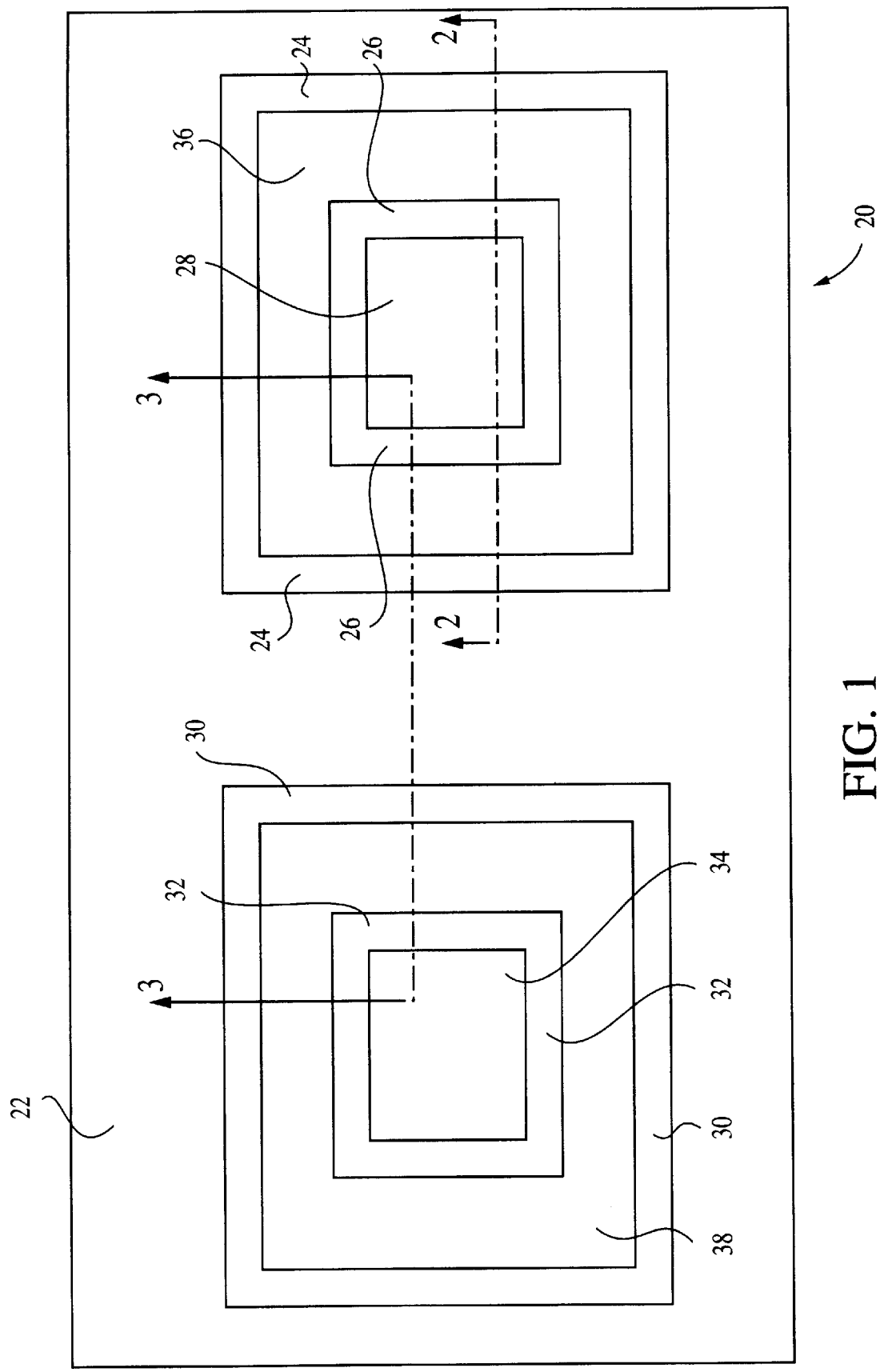
FIG. 1 is a top plan view illustrating a semiconductor integrated circuit in accordance with the present invention.

Referring to FIG. 1, there is illustrated a semiconductor integrated circuit (IC) 20 in accordance with the present invention. The IC 20 preferably includes a single SOI substrate 22, but it will be understood that the teachings of the present invention can also be applied to non-SOI substrates. The SOI substrate 22 includes a "white space" 23, two isolation trenches 24, 26 that isolate a first device mesa 28 and two isolation trenches 30, 32 that isolate a second device mesa 34. The "white space" is defined herein as areas of an IC comprising only substrate. The isolation trenches 24, 26 define a first guard ring region 36 therebetween, and the isolation trenches 30, 32 define a second guard ring region 38 therebetween. The isolation trenches 24, 26, 30, 32 may be filled with silicon oxide or some other material, such as for example, oxide/polysilicon. Further, isolation trenches 24, 26, 30, 32 may be constructed with multiple materials having a multi-chambered configuration. One preferred embodiment of the isolation trenches 24, 26, 30, 32 is described in detail below with reference to FIGS. 11–13. It will be understood that the first and second device mesas 28, 34 may comprise many different types of integrated circuit devices, such as for example, transistors, diodes, capacitors, etc. Furthermore, any number of devices, device mesas, and trenches may be included on the SOI substrate 22.

Figure 2:
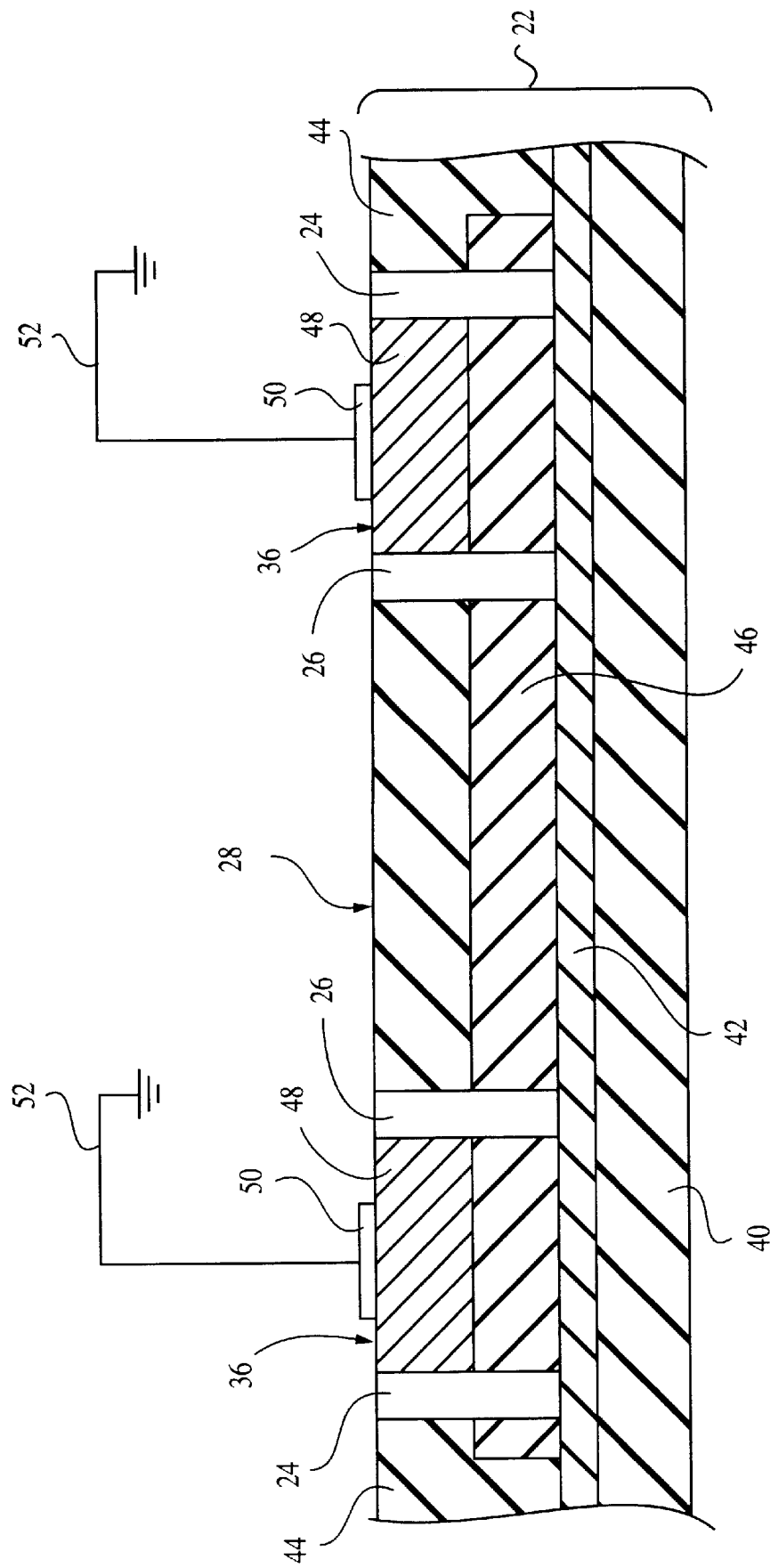
FIG. 2 is a sectional view illustrating the semiconductor integrated circuit of FIG. 1 taken along line 2—2.

Referring to FIG. 2, the SOI substrate 22 includes a silicon support substrate 40 and an insulating layer 42 that separates the first device mesa 28 from the silicon support substrate 40. By way of example, the support substrate 40 may be formed of a p⁻-type semiconductor substrate of a silicon single crystal, and the insulating layer 42 may be formed of a silicon oxide film, also referred to as SOI oxide. The support substrate 40 is preferably formed of a high resistivity (or high "Z") substrate having a high Ohm-centimeter rating, such as, for example, a 1 KΩ-centimeter substrate. While a 1 KΩ-centimeter substrate performs very well, it will be understood that a substrate is considered herein to be a high resistivity substrate if it has an Ohm-centimeter rating above approximately 100 Ω-centimeter. It will be understood that a substrate is considered herein to be a high-Z substrate if it has an Ohm-centimeter rating above approximately 10 Ω-centimeter. The first guard ring region 36 surrounds the first device mesa 28 and is isolated from the first device mesa 28 by the isolation trench 26. The isolation trench 24 isolates the first guard ring region 36 from a surrounding field epitaxial region 44 (i.e., the white space 23 as shown in FIG. 1). An n-type buried layer (NBL) 46 extends into the first guard ring region 36, and an n-type collector (CN) 48 is implanted into the first guard ring region 36. The CN 48 is preferably heavily doped. Metal contacts 50 are made to the n-type collector 48 of the first guard ring region 36 to provide a low resistance RF ground along conductors 52. The conductors 52 are preferably coupled to an RF ground node. It should be understood that the first and second guard ring regions 36, 38, as well as the buried layer 46 and the collector 48, may also be formed from p-type material.

Figure 3:
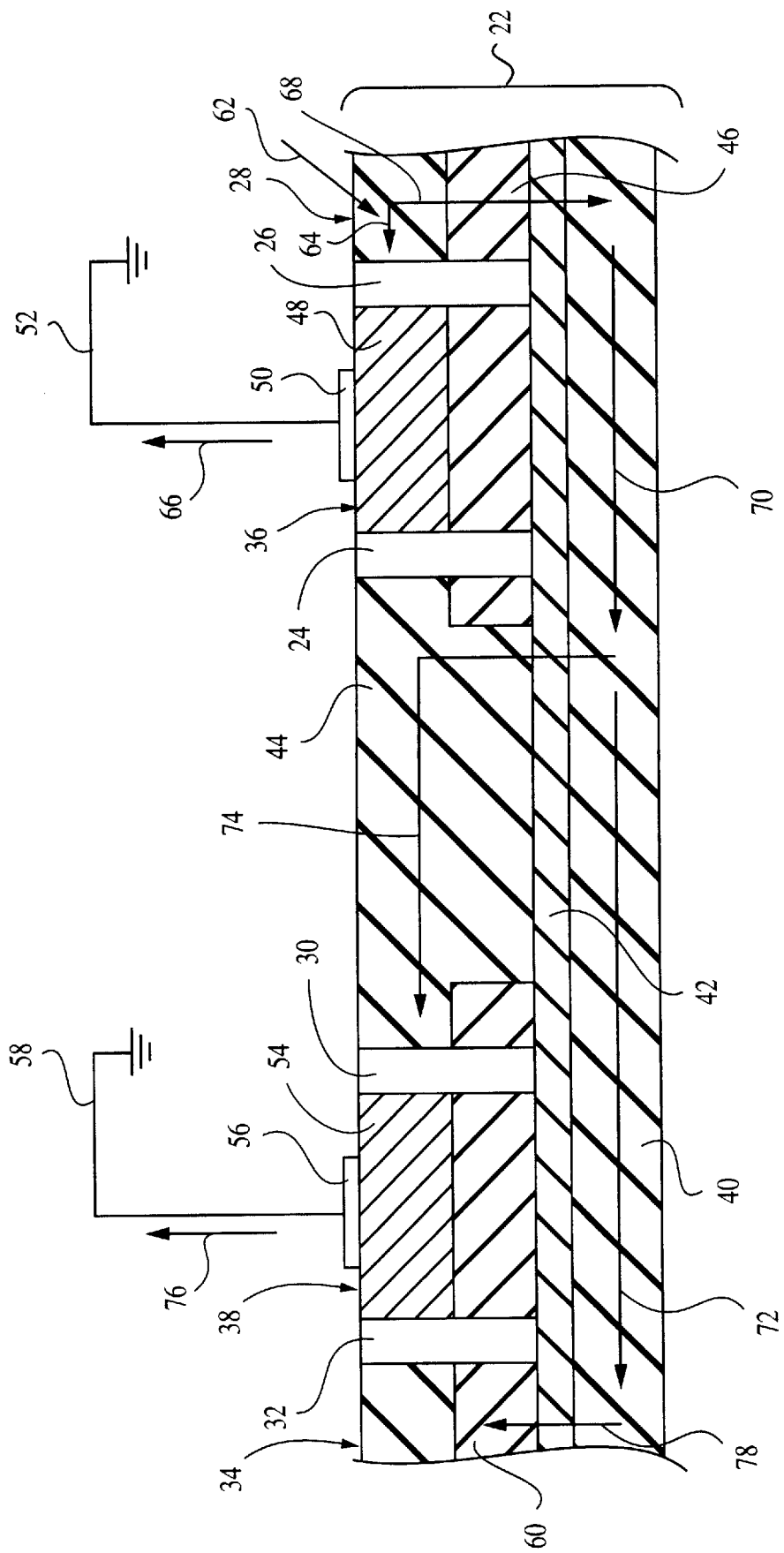
FIG. 3 is a sectional view illustrating the semiconductor integrated circuit of FIG. 1 taken along line 3—3.
Figure 4:
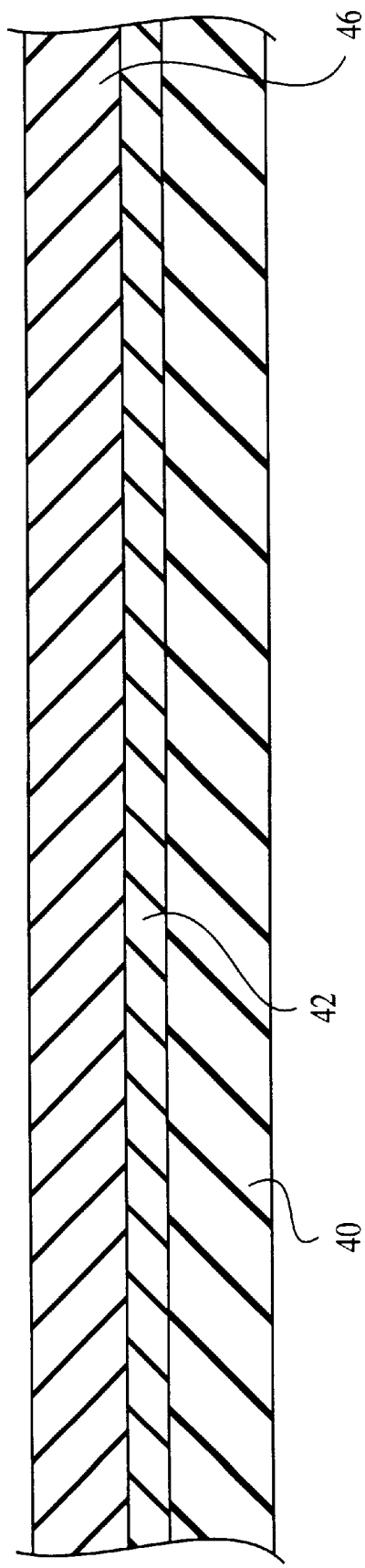
FIGS. 4–8 are sectional views illustrating a method of manufacturing the section of the semiconductor integrated circuit shown in FIG. 2.

Referring now to FIG. 3, the second guard ring region 38 surrounds the second device mesa 34 and is isolated from the second device mesa 34 by the isolation trench 32. The isolation trench 30 isolates the second guard ring region 38 from the surrounding field epitaxial region 44. An NBL 60 extends into the second guard ring region 38, and a CN 54 is implanted into the second guard ring region 38. Metal contacts 56 are made to the CN 54 of the second guard ring region 38 to provide a low resistance RF ground along the conductor 58. The conductors 58 are preferably coupled to an RF ground node.

The first and second guard ring regions 36, 38 provide excellent RF isolation. One reason for the RF isolation is that electric fields created by RF power are terminated by the shunt to RF ground conductors 52, 58. Having these RF grounds around the first and second device mesas 28, 34 greatly improves RF isolation. Another source of RF isolation is provided via the use of SOI technology. The insulating layer 42 provides additional RF isolation. Finally, the use of a high Z substrate 40 improves RF isolation by making the substrate 40 a high resistance path for RF power. Any leaking RF power will seek the path of least resistance that will not be the substrate 40 when a high Z substrate is used.

The first guard ring region 36 is completely isolated by the trenches 24 and 26 and the insulating layer 42. Similarly, the second guard ring region 38 is completely isolated by the trenches 30 and 32 and the insulating layer 42. This allows for easy bias of the first and second guard ring regions 36 and 38. The low resistivity guard ring regions 36 and 38 provide an excellent RF ground shunt. Furthermore, the low capacitance guard ring structures 36 and 38 have a small impact on junction capacitance "Cjs". Specifically, the guard ring region 36 has little impact on Cjs because the Cjs are dominated by the oxide in the trench 26 surrounding the device mesa 28. The heavily doped guard ring region 36 helps keep the region around the device mesa 28 at an AC or RF ground potential. The substrate 40, when a high resistivity (e.g. 1 KΩ-cm) substrate is used, contributes less to the Cjs than does standard resistivity (10–30 Ω-cm) material. In addition, with a high Z substrate 40, RF power will take a path of least resistance through the lower resistivity epitaxial layer 44. The RF power is shunted to ground through the guard ring region 36. Also, because the Cjs (with a high Z substrate) are dominated by the side wall trench 26, additional leaking RF power will leak out the side as opposed to through the substrate 40. The same is true for the guard ring region 38.

To illustrate the manner in which the present invention improves device to device isolation (such as RF power isolation), the isolation between the first device mesa 28 and the second device mesa 34 is now described. In general, RF power that leaks from the device mesa 28 follows the path of least resistance. If the substrate 40 is a high resistivity (high Z) substrate, the RF power will prefer to flow through the epitaxial region 44. The RF power will eventually be shunted to ground out of the guard ring region 38.

More specifically, arrow 62 shows the power created by the first device mesa 28. The power is transmitted into the SOI substrate 22 in the direction of the arrow 62. Any power that manages to go through the trench 26, as indicated by the arrow 64 gets shunted to ground via the conductor 52 as indicated by the arrow 66. Thus, this power does not reach the second device mesa 34. Some power may also manage to go through the insulating layer 42 as indicated by the arrow 68. This power can be laterally conducted through the silicon support substrate 40 as indicated by the arrow 70. If, however, the substrate 40 is a high resistivity substrate, the RF power that leaks from the device mesa 28 will prefer the epitaxial region 44 (path of least resistance) to the substrate 40. Even RF power that is directly injected into the substrate 40 moves into the epitaxial region 44 because that is the path of least resistance. Thus, the RF power will be transmitted back through the insulating layer 42 into the epitaxial region 44 (as indicated by arrow 74) as soon as it has passed under the guard ring region 36. If this power manages to go through the trench 30, however, it will be shunted to ground by the conductor 58 as indicated by the arrow 76. Thus, this power will also not reach the second device mesa 34.

The RF power in the support substrate 40 will continue along the path 72 only if the support substrate 40 is of a standard resistivity (10–30 Ω-cm) material and not high Z. In this scenario, the RF power in the support substrate 40 can be transmitted back through the insulating layer 42 under the second device mesa 34 as indicated by arrow 78. This power, however, will be greatly attenuated after leaving the first device mesa 28 because it will have had to travel through the insulating layer 42 twice.

Although the present RF isolation invention has been described in the context of surrounding a device mesa to prevent RF power from entering or leaving, one of ordinary skill in the art shall recognize that alternative uses for the present invention are possible without departing from the scope or spirit of the present invention. For example, the present invention can be utilized in the "white space" 23 (FIG. 1) of the IC 20 (FIG. 1) to prevent RF power from moving through the IC 20. In another example the present invention can be utilized under electrical circuit lines or signal lines of the IC 20 to prevent RF power from moving from the lines into the IC 20.

The process for manufacturing the semiconductor IC 20 is described with reference to FIGS. 4 through 8. First, the support substrate 40 is prepared and formed with the insulating layer 42 over its main surface. The insulating layer 42 may be formed, for example, of a silicon oxide film. This silicon oxide film is formed by thermally oxidizing the support substrate 40.

In order to form the NBL 46, a semiconductor substrate (not shown) is laid over the main surface of the insulating layer 42. The semiconductor substrate is adhered to the insulating layer 42 by a heat treatment, following which, the semiconductor substrate has its upper surface etched by a polishing treatment in order to reduce its thickness. The semiconductor substrate thereby thinned is doped all over its main surface with an n-type impurity by, for example, ion implantation. After this, the semiconductor substrate is thermally diffused to form the $n^+$-type buried layer 46.

Figure 5:
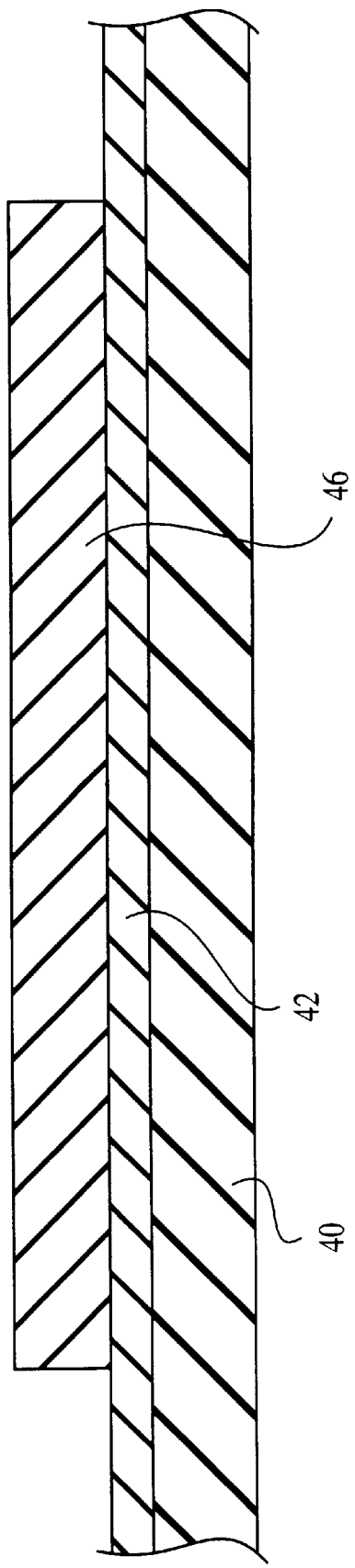

Anisotropic etching, such as Reactive Ion Etching (RIE), may be used to etch the NBL 46 to form the structure shown in FIG. 5.

Figure 6:
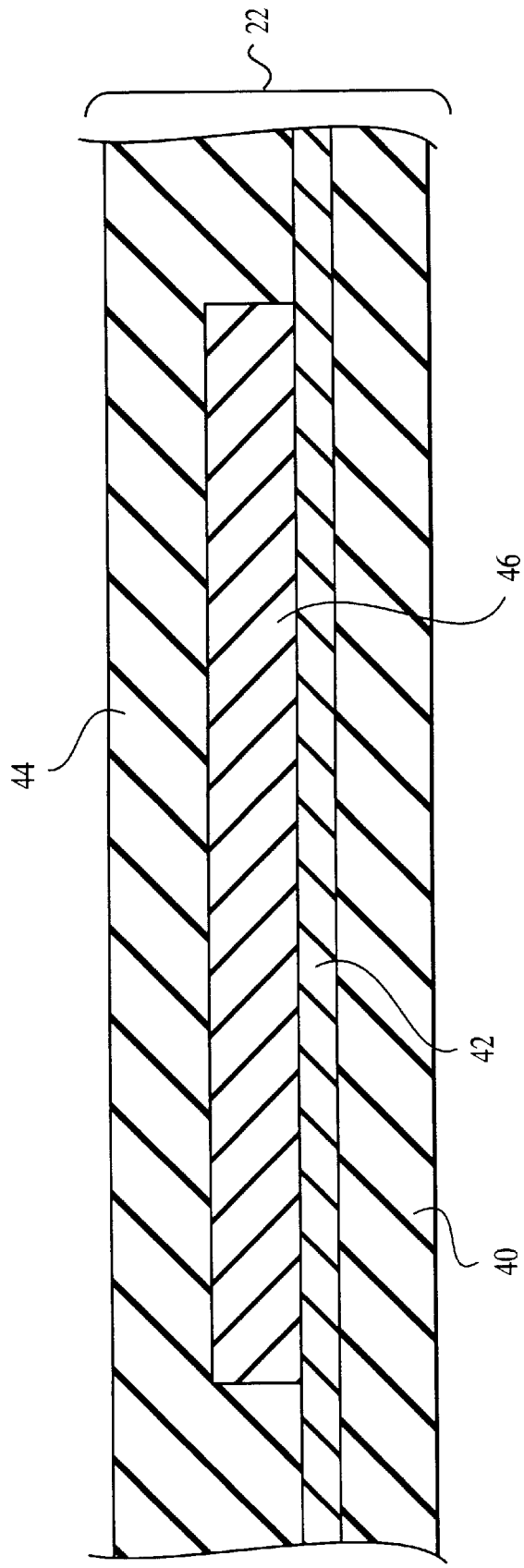

Referring now to FIG. 6, the $n^-$-type epitaxial layer 44 is grown by epitaxial growth all over the surface of the NBL 46. The NBL 46 has its n-type impurity slightly diffused into the $n^-$-type epitaxial layer 44. This results in the SOI substrate 22 having a multi-layered structure that includes the NBL 46 and the $n^-$-type epitaxial layer 44 laid over the main surface of the insulating layer 42. The epitaxial layer 44 and the NBL (buried layer) 46 are examples of additional semiconductor layers that may be formed on the insulating layer 42.

Figure 7:
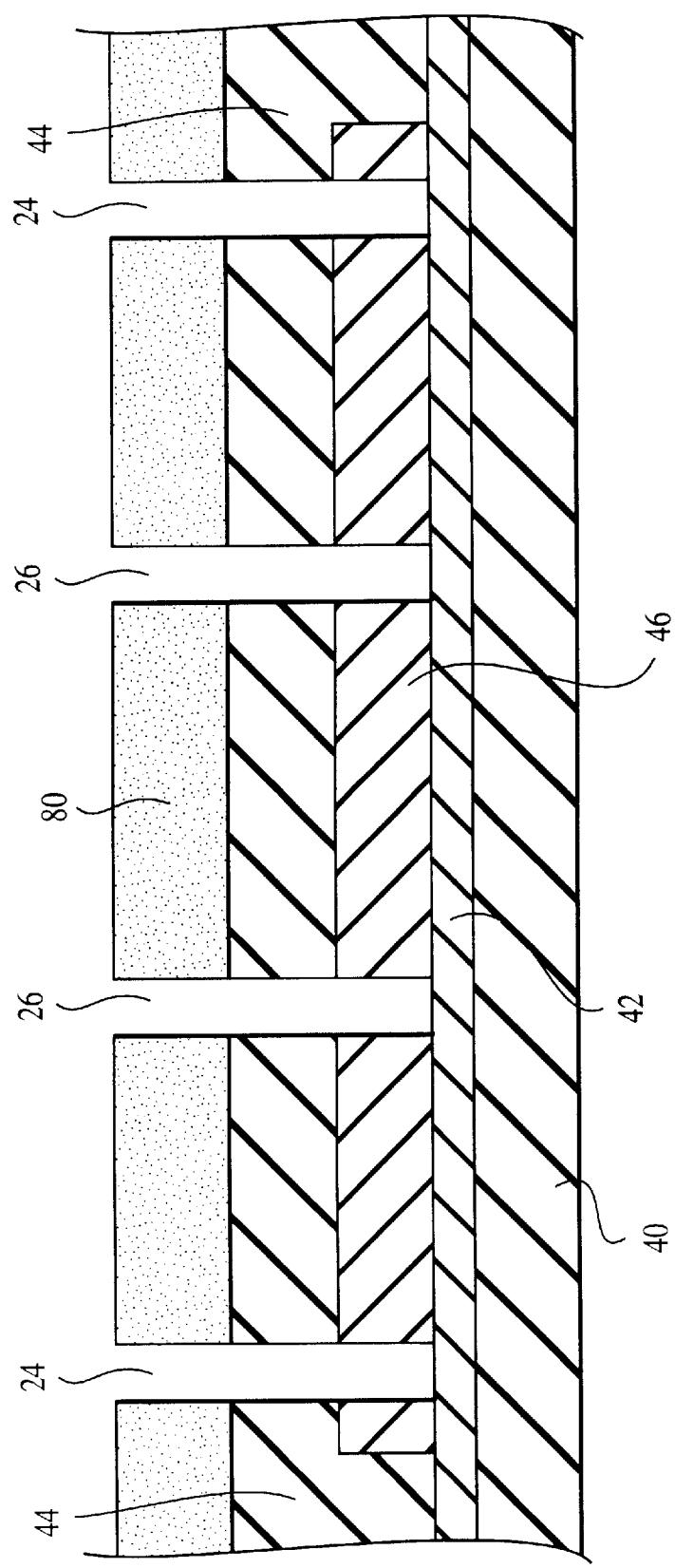

Referring now to FIG. 7, the trenches 24 and 26 are formed by anisotropic etching, such as, for example, RIE. Specifically, the trenches 24 and 26 extend from the main surface of the epi layer 44 to the insulating layer 42. A photoresist 80 may be used as a mask for the etching. Alternatively, a hard mask may be used as a mask for the etching in place of the photoresist 80. After the photoresist 80 is removed, an insulator is buried in the trenches 24 and 26. This insulator is formed, for example, by depositing a silicon oxide film all over the main surface of the epi layer 44 by the CVD method and by etching back the whole surface of the silicon oxide film. An etch-back is carried out as thick as the deposited silicon oxide film to bury the trenches 24 and 26 with the silicon oxide. The silicon oxide film is over-etched off except from the inside of the trenches 24 and 26. Alternatively, the trenches 24 and 26 could be filled with other materials, such as for example, oxide/polysilicon.

Figure 8:
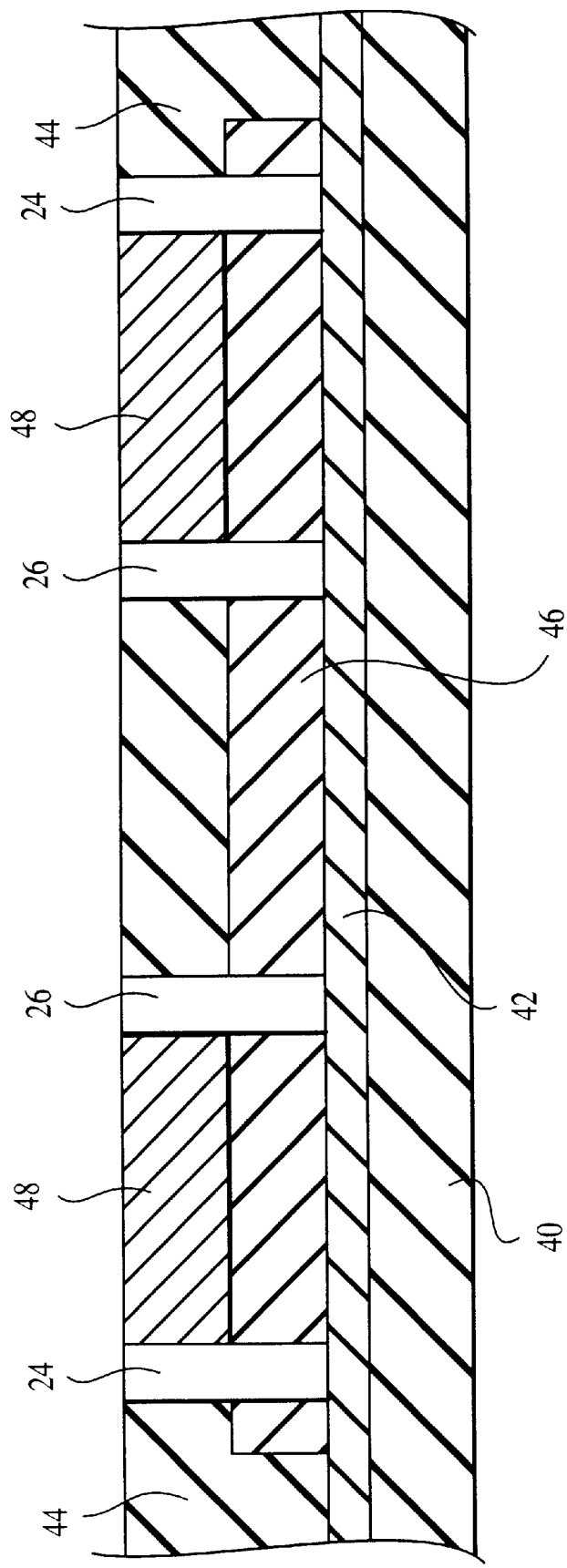

Referring now to FIG. 8, the n-type collector (CN) 48 is implanted into the first guard ring region 36. Specifically, the surface of the region 48 may be selectively doped with an n-type impurity (e.g., phosphor) by ion implantation. Thermal diffusion is carried out to form the n-type collector 48 in the epitaxial layer 44. The CN 48 is preferably heavily doped. It should be understood that the collector 48 may alternatively be formed from p-type material. Finally, the metal contacts 50 are made to the n-type collector 48, and the conductors 52 are attached, to form the structure shown in FIG. 2.

It will be understood that any type of semiconductor element or elements may be formed in the first device mesa 28. The semiconductor element or elements may be active, passive, or a combination of both. For example, the first device mesa 28 may include one or more transistors, diodes, capacitors, resistors, etc.

An example of one particular SOI technology that may be used in the present invention is the bonded SOI BiCMOS process technology mentioned above, namely, the SOI BiCMOS process technology that is available from Hitachi Ltd. of Japan, and specifically, the Hitachi Ltd. Device Development Center in Tokyo, Japan. As mentioned above, this SOI BiCMOS process technology is also described in U.S. Pat. Nos. 5,661,329, 5,773,340, and 5,430,317, the complete disclosures of which are all hereby fully incorporated into the present application by reference for their teachings on SOF BiCMOS process technologies. Specifically, it has been found that this silicon-on-insulator (SOI) BiCMOS technology has many characteristics that are preferred to alternative technologies. There are also several features that make it particularly well suited to RF applications. With SOI, the insulating layer separates circuit devices from the solid silicon substrate. A trench isolation structure may also be used which provides a lateral barrier between circuit elements. These features isolate signals and minimize the undesired coupling that would otherwise limit performance. Because parasitic effects also limit the speed at which a circuit can operate, ICs made with SOI offer exceptional high-frequency operation while minimizing power dissipation. Finally, the isolating properties of the SOI technology allow more functions to be packed into a smaller area. These characteristics translate into advantages in performance, battery life, and size for the end product.

Figure 9:
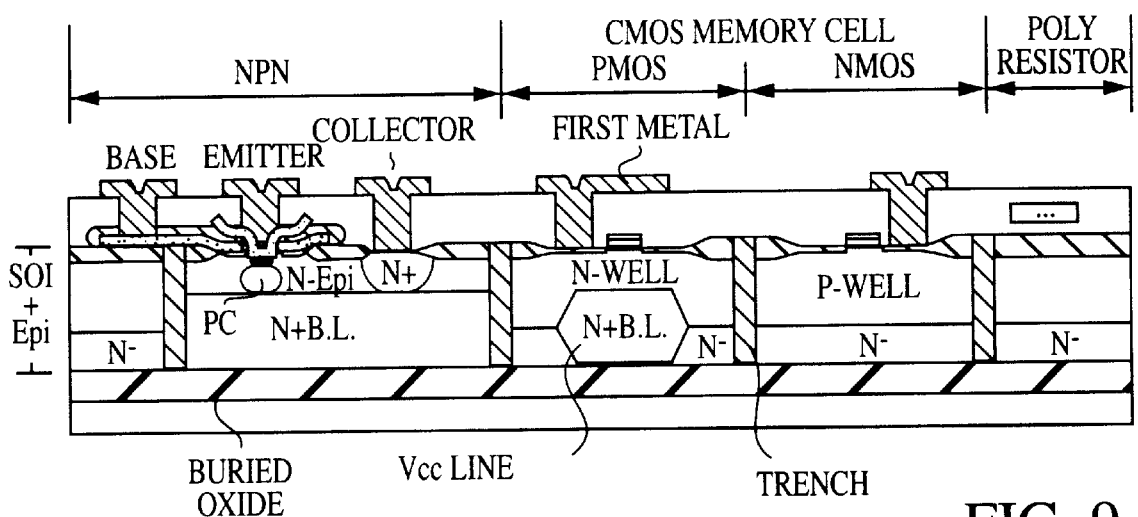
FIG. 9 is a cross-sectional view of semiconductor devices fabricated using a silicon-on-insulator (SOI) process technology.
Figure 10:
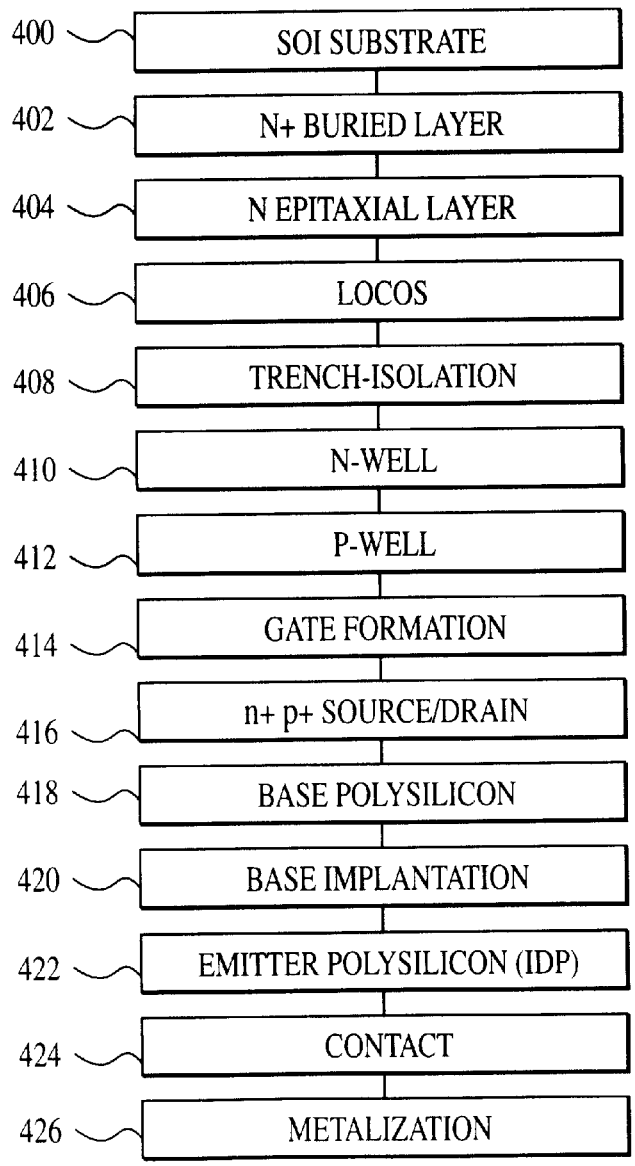
FIG. 10 is a flow diagram illustrating the process steps used to fabricate the semiconductor devices shown in FIG. 9.

Referring now to FIG. 9, there is illustrated a cross-section of the ECL-CMOS process technology discussed in the paper entitled "A 0.35 um ECL-CMOS Process Technology on SOI for 1 ns Mega-bits SRAM's with 40 ps Gate Array" described hereinabove. FIG. 10 illustrates the general process steps discussed in that same paper.

FIG. 9 shows the cross-sectional view of a 0.35 $\mu$m ECL-CMOS process technology. A bipolar transistor, 1 bit CMOS memory cell and poly resistor are shown. Three key technologies adopted for this device are SOI substrate, trench isolation and the IDP (In-situ phosphorus doped polysilicon) emitter technology. The bipolar transistor includes a double polysilicon self-aligned structure with IDP emitter and the pedestal collector. IDP can avoid the plug effects which causes $f_r$ degradation in a small size emitter. To reduce CMOS memory cell size and to achieve a latch-up free configuration, an n+ buried layer for the Vcc line and a trench isolation combined with LOCOS are used.

Referring now to FIG. 10, the fabrication process begins in step 400 with the SOI substrate. The starting material is a SOI substrate with 1.5 $\mu$m thick Si layer and 0.5 $\mu$m buried oxide layer. The buried layer is formed in step 402, and the epitaxial layer is formed in step 404. Only $n^+$ region is prepared for a buried layer. The voltage drop of buried Vcc line is small enough by reducing sheet resistance of the $n^+$ layer down to about 45 Ohm-square. A 0.7 $\mu$m thick epitaxial layer is grown. The LOCOS is formed in step 406, and the trench isolation is formed in step 408. The thickness of LOCOS oxidation is 0.4 $\mu$m. The trench is formed after LOCOS oxidation. The width of the trench is preferably 0.4 $\mu$m. It is filled and planarized with CVD oxide film. The n-wells and p-wells are formed in steps 410, 412, respectively. The n-wells and p-wells are formed by high-energy implantation through LOCOS with two masks.

Channel implantation is performed simultaneously to control the threshold voltages (Vth) of the NMOS and PMOS transistors. The gate is formed in step 414, and the source and collector is formed in step 416. Gate electrodes are formed by Wsi$_2$/polysilicon structure. The thickness of the gate oxide is preferably 9 nm. After the gate patterning, the source and drain regions are formed. The base is formed in steps 418, 420, and the emitter is formed in step 422. The base and the emitter of the bipolar transistors are fabricated by the self-aligned process. Base polysilicon is deposited and a hole is formed in the emitter region. Intrinsic base implantation and pedestal collector implantation is then carried out. After sidewall spacer of polysilicon is formed, the emitter electrode and shallow emitter are simultaneously fabricated using IDP technology with rapid thermal annealing (RTA) at 950° C. An SOG etch-back technique is used for planarization after PSG deposition and a contract hold formation is followed in step 424. Finally, six layers of metalization are performed in step 426.

Figure 11:
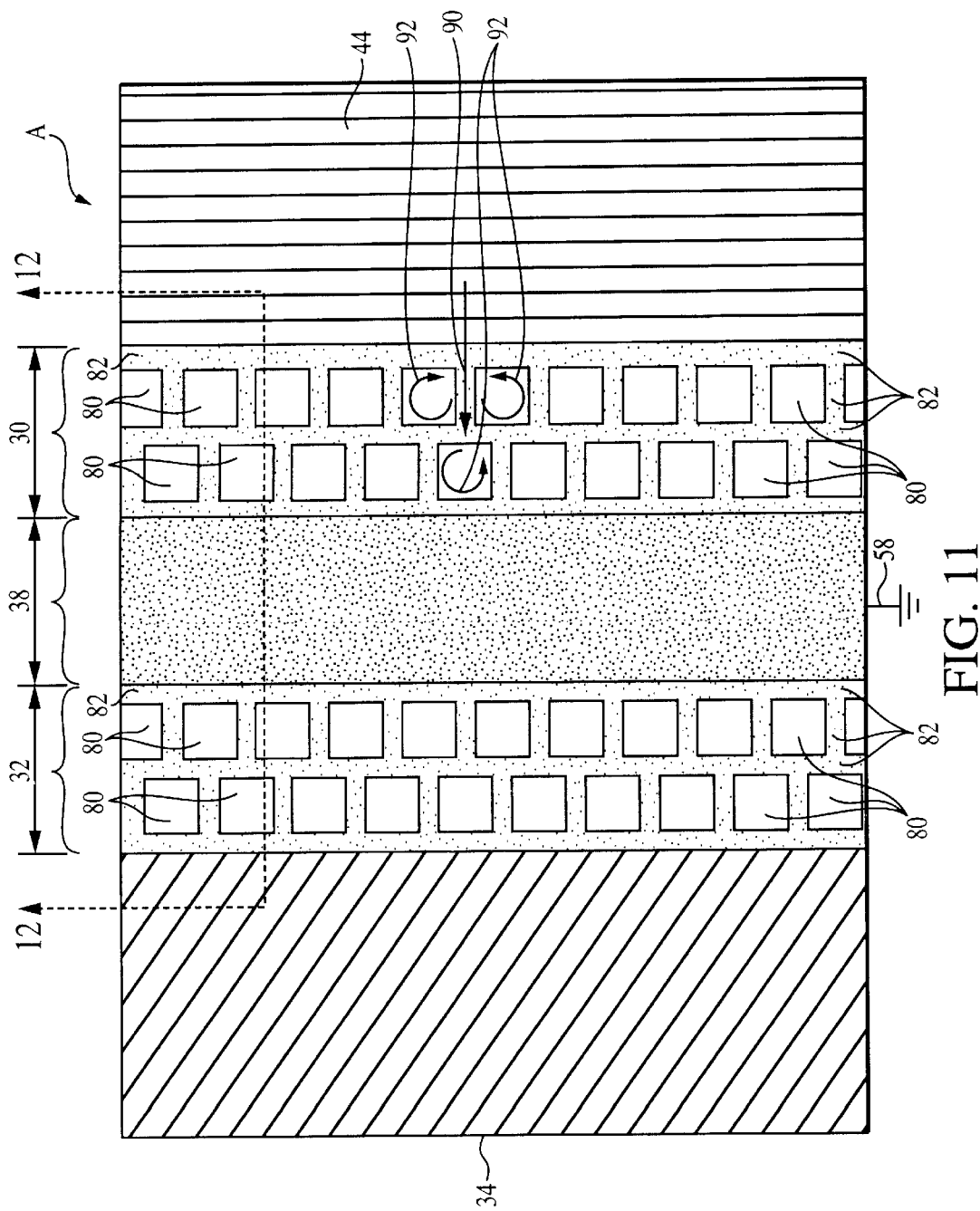
FIG. 11 shows an enlarged view of sub-section A of the top plan view of FIG. 1.

The preferred embodiment of the isolation trenches 24, 26, 30, and 32 is now described in more detail with reference to FIGS. 11–13. As isolation trenches 24, 26, 30 are substantially similar to isolation trench 32, only isolation trench 32 is described in detail hereinbelow. The description of the other isolation trenches 24, 26 and 30 is similar to that of trench 32. FIG. 11 shows an enlarged top view of section A of FIG. 1. As shown in FIG. 11, the isolation trench 30 comprises a plurality of isolation chambers 80 and a plurality of isolation walls 82. The isolation walls 82 preferably comprise a non-conductive material such as silicon oxide and oxide/polysilicon. The isolation walls 82 define the isolation chambers 80. The plurality of isolation chambers 80 preferably comprises a highly conductive material such as silicon. The highly conductive material is preferably less conductive than is the material comprising the second guard ring region 38. The highly conductive material is created using any well-known counter-doping technique. Those skilled in the IC fabrication art shall recognize that different methods of producing highly conductive material can be to practice with the present invention without departing from the scope and spirit of the present invention.

Those skilled in the IC fabrication art shall recognize that many different isolation chamber shapes and configurations can be used to practice the present invention. As long as the isolation chambers 80 are relatively small in size with respect to the size of the isolation trench and are completely isolated from one another, a variety of different chamber shapes and sizes can be used. For example, in the embodiment shown in FIG. 11, the isolation chambers 80 are substantially square-shaped and configured into two parallel asymmetric rows. Square-shaped isolation chambers 80 are exemplary only. Also, one skilled in the IC fabrication art shall recognize that different numbers of rows can be used to practice the present invention without departing from the scope of the present invention. For example, one, three or four rows can also be used. Alternative embodiments of isolation chamber shapes and configurations are described below with reference to FIG. 13. FIG. 12 shows a cross-sectional view of the embodiment of FIG. 11, taken along line 12 of FIG. 11. As shown in FIG. 12, the isolation chambers 80 and the isolation walls 82 are preferably disposed on top of the insulating layer 42.

Figure 12:
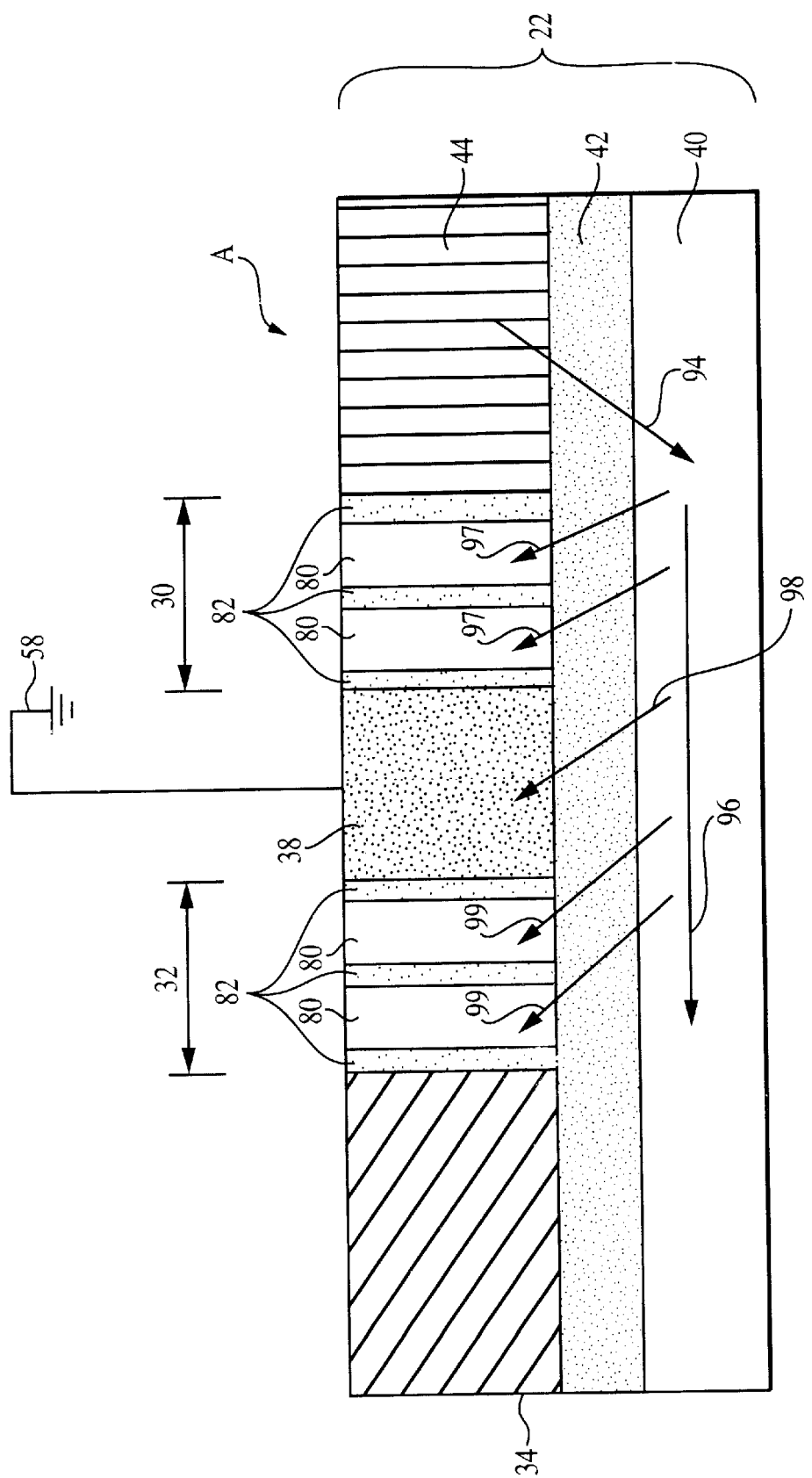
FIG. 12 shows a cross-sectional view taken along line 12 of FIG. 11.

Referring simultaneously to FIGS. 11 and 12, the isolation trenches 30, 32 and the second guard ring region 38 provide excellent RF isolation for the second device mesa 34. One reason for this excellent RF isolation is that electric fields created by RF power prefer the path of least resistance and flow to the isolation chambers 80. The RF power that flows into an isolation chamber 80 remains within the isolation chamber 80 because the chamber 80 comprises highly conductive material and because isolation is provided by surrounding isolation chambers 80. This results in an "eddy" current or circular flow of current within the isolation chambers 80. RF isolation is greatly improved because eddy currents produce counter magnetic and electric fields that help dissipate RF power. Other reasons for excellent RF isolation have been described above with reference to FIGS. 1–3 and include the uses of the RF ground conductor 58, the SOI substrate 22 and the high resistivity (or high Z) substrate 40.

In order to illustrate the manner in which the present invention improves device isolation (such as RF power isolation), the isolation of the second device mesa 34 is now examined. In general, RF power that leaks into the surrounding field epitaxial region 44 will follow the path of least resistance. If the substrate 40 is a high resistivity (high Z) substrate, the RF power will prefer to flow through the surrounding field epitaxial region 44 and the insulating layer 42.

Referring to FIG. 11, arrow 90 shows RF power moving from the surrounding field epitaxial region 44 to the isolation trench 30. The RF power penetrates the isolation wall 82. The RF power (following the path of least resistance) will prefer to flow into the highly conductive material of the plurality of isolation chambers 80. As described above and as shown by the arrows 92, the RF power that manages to flow into the plurality of isolation chambers 80 produces eddy currents that remain within the isolation chambers 80 due to their highly conductive material and due to the isolation provided by the surrounding isolation chambers 80. Any power that manages to penetrate through the isolation trench 30 will be shunted to ground out of the second guard ring region 38.

Referring now to FIG. 12, arrow 94 shows RF power moving from the surrounding field epitaxial region 44 through the insulating layer 42 into the support substrate 40. This power can be conducted laterally through the silicon support substrate 40 as indicated by the directional arrow 96. If, however, the substrate 40 is a high resistivity (high Z) substrate, the RF power will prefer the less resistive path provided by the isolation chambers 80 of the isolation trench 30, the second guard ring region 38 or the isolation chambers 80 of the isolation trench 32. Directional arrows 97 show RF power moving through the insulation layer 42 into the isolation chambers 80 of the isolation trench 30. This RF power will be greatly attenuated because it has moved through the insulation layer 42.

The attenuated RF power produces eddy currents within the isolation chambers 80 as described above with reference to FIG. 11. Arrow 98 shows RF power moving through the insulation layer 42 into the second guard ring region 38. This RF power will be shunted to ground by the conductor 58. Arrows 99 show RF power moving through the insulation layer 42 into the isolation chambers 80 of the isolation trench 32. This RF power will be greatly attenuated because it has moved through the insulation layer 42. The attenuated RF power produces eddy currents within the plurality of isolation chambers 80 as described above with reference to FIG. 11. Thus, RF isolation for the second device mesa 34 is greatly improved and RF power from other devices located on the IC 20 will be greatly attenuated when moving to the second device mesa 34. Similarly, RF power from the second device mesa 34 will be isolated in a similar manner as is the RF power that enters from the surrounding field epitaxial region 44 (originating from another device mesa on the IC 20) due to the operation of the isolation trenches 30, 32 and the second guard ring region 38.

Figure 13C:
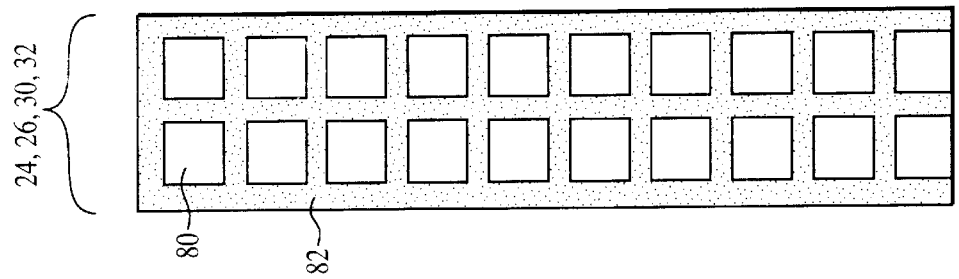
FIG. 13*c* shows square-shaped isolation chambers in a symmetrical 2-row configuration.
Figure 13B:
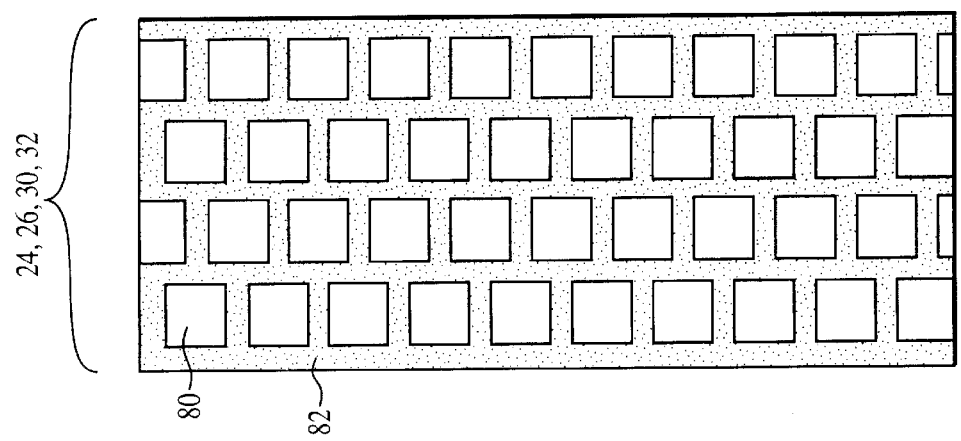
FIG. 13*b* shows square-shaped isolation chambers in an asymmetrical 4-row configuration.
Figure 13A:
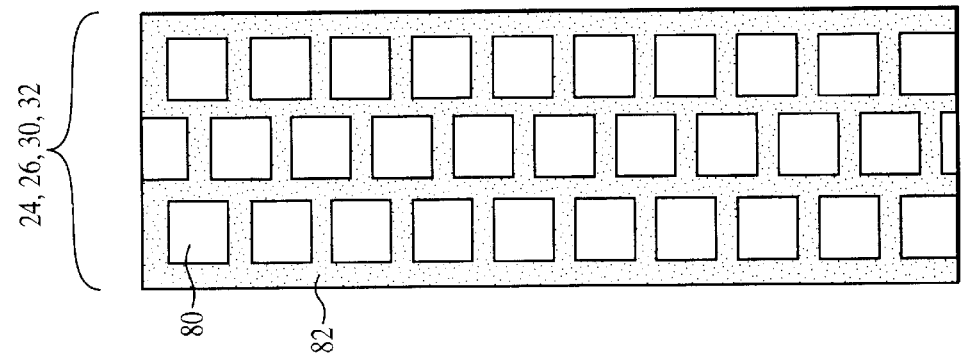
FIG. 13*a* shows square-shaped isolation chambers in an asymmetrical 3-row configuration.
Figure 13G:
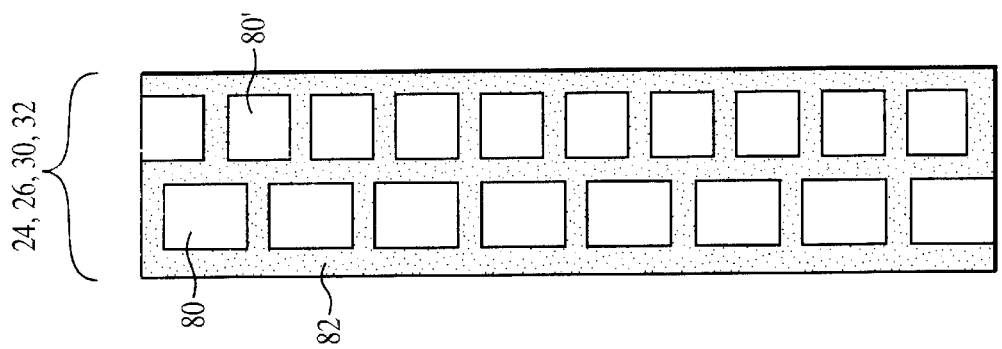
FIG. 13*g* shows one row of rectangular-shaped isolation chambers and one row of square-shaped isolation chambers.
Figure 13F:
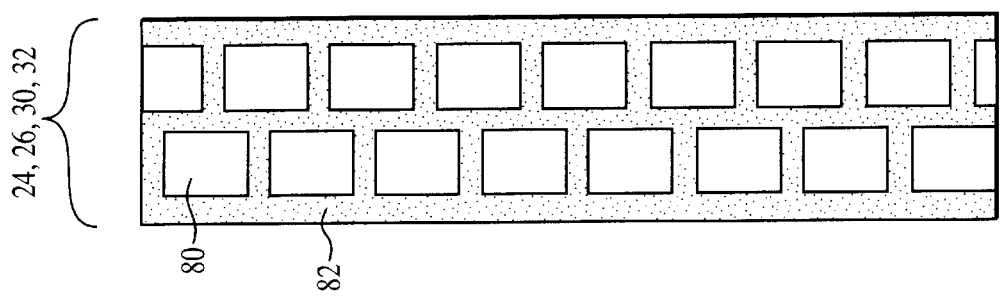
FIG. 13*f* shows rectangular-shaped isolation chambers in an asymmetrical 2-row configuration.
Figure 13E:
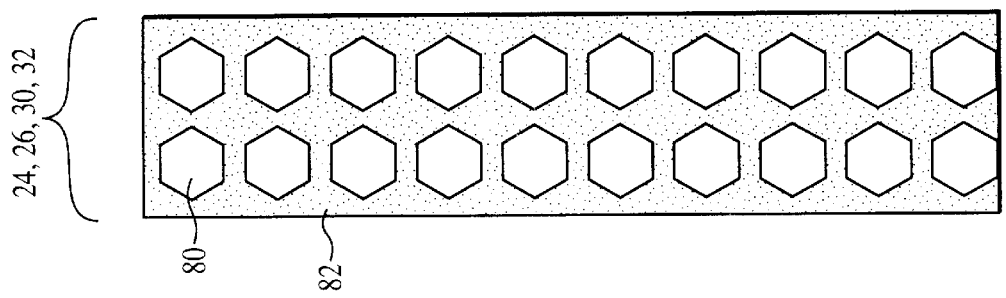
FIG. 13*e* shows hexagon-shaped isolation chambers in a symmetrical 2-row configuration.
Figure 13D:
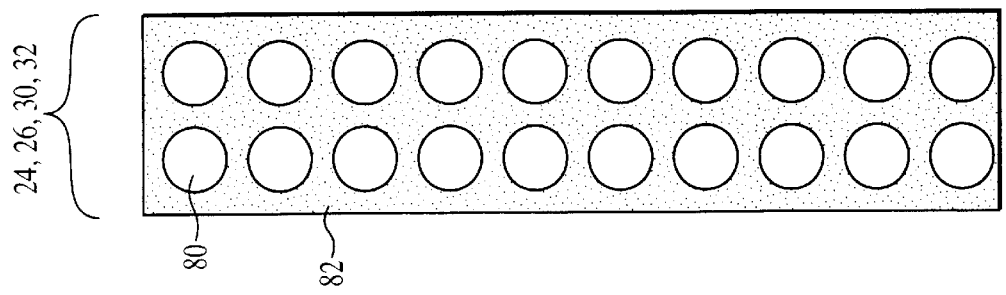
FIG. 13*d* shows circular-shaped isolation chambers in a symmetrical 2-row configuration.

Several alternative embodiments of the isolation trenches 24, 26, 30, 32 are now described with reference to FIG. 13. One skilled in the IC fabrication art shall recognize that these alternative embodiments can be used to practice the present invention without departing from the scope or spirit of the present invention. FIG. 13a shows the plurality of isolation chambers 80 in an asymmetrical 3-row configuration. In this configuration, the isolation chambers 80 are square-shaped. FIG. 13b shows the plurality isolation chambers 80 in an asymmetrical 4-row configuration. In this configuration, the isolation chambers 80 are square-shaped. FIGS. 13c–e show the isolation chambers 80 in a symmetrical two-row configuration. FIG. 13c shows square-shaped isolation chambers 80. FIG. 13d shows circular-shaped isolation chambers 80. FIG. 13e shows hexagon-shaped isolation chambers 80. FIGS. 13f–g shows the isolation chambers 80 in an asymmetrical two-row configuration. FIG. 13f shows rectangular-shaped isolation chambers 80. FIG. 13g shows one row of rectangular-shaped isolation chambers 80 and one row of square-shaped isolation chambers 80'. Those skilled in the IC fabrication art shall recognize that several alternative combinations and chamber shapes and configurations can be used to practice the present invention.

In summary, a multi-chambered trench isolated guard ring region for providing RF isolation is disclosed herein. The present RF isolation apparatus channels RF power into isolation chambers or guard ring regions. The isolation chambers produce eddy currents from RF power, and thus, reduce RF power that is radiated into device mesas. The guard ring regions shunt RF power to ground. The present invention is particularly useful for densely packed integrated circuits, and particularly, Silicon-On-Insulator process technology. The present invention is preferably constructed in a layered and multi-chambered configuration. The present invention provides a highly insulating RF isolation apparatus.

Several embodiments of the present invention have been described. Nevertheless, it will be understood that various modifications may be made without departing from the spirit and scope of the invention. For example, the isolation chambers of the present invention are preferably square-shaped and in a two-row configuration. However, the isolation chambers can compare one or more rows having a variety of different shapes that are relatively small with respect to the isolation trench.

Accordingly, it is to be understood that the invention is not to be limited by the specific illustrated embodiment, but only by the scope of the appended claims.

What is claimed is:

1. A semiconductor integrated circuit (IC) device comprising:
    a) a substrate;
    b) an insulating layer formed on the substrate;
    c) additional semiconductor layers formed on the insulating layer;
    d) a first isolation trench formed in the additional semiconductor layers that extends to the insulating layer and that surrounds a first selected surface area of the additional semiconductor layers, wherein the first isolation trench comprises a plurality of first isolation walls and a plurality of first isolation chambers, wherein the plurality of first isolation chambers comprises conductive material, and wherein the plurality of first isolation walls comprises non-conductive material;
    e) a second isolation trench formed in the additional semiconductor layers that extends to the insulating layer and that surrounds the first isolation trench and defines a guard ring region between itself and the first isolation trench, wherein the second isolation trench comprises a plurality of second isolation walls and a plurality of second isolation chambers, wherein the plurality of second isolation chambers comprises conductive material, and wherein the plurality of second isolation walls comprises non-conductive material; and
    f) a ground conductor which couples the guard ring region to a ground node.

2. A semiconductor IC device in accordance with claim 1, wherein the additional semiconductor layers comprise:
    (a) a buried layer formed on the insulating layer; and
    (b) an epitaxial layer of a first conductivity type formed on the buried layer.

3. A semiconductor IC device in accordance with claim 1, further comprising:
    (a) a collector implanted into the guard ring region; and
    (b) a contact made to the collector to which the ground conductor is coupled.

4. A semiconductor IC device in accordance with claim 1, wherein the ground node comprises an RF ground node.

5. A semiconductor IC device in accordance with claim 1, wherein the plurality of first and second isolation chambers are square-shaped and have a two-row asymmetrical configuration.

6. A semiconductor IC device in accordance with claim 1, wherein the plurality of first and second isolation chambers are square-shaped and have a three-row asymmetrical configuration.

7. A semiconductor IC device in accordance with claim 1, wherein the plurality of first and second isolation chambers are square-shaped and have a four-row asymmetrical configuration.

8. A semiconductor IC device in accordance with claim 1, wherein the plurality of first and second isolation chambers are square-shaped and have a two-row symmetrical configuration.

9. A semiconductor IC device in accordance with claim 1, wherein the plurality of first and second isolation chambers are circular-shaped and have a two-row symmetrical configuration.

10. A semiconductor IC device in accordance with claim 1, wherein the plurality of first and second isolation chambers are hexagonal-shaped and have a two-row symmetrical configuration.

11. A semiconductor IC device in accordance with claim 1, wherein the plurality of first and second isolation chambers are rectangular-shaped and have a two-row asymmetrical configuration.

12. A semiconductor integrated circuit (IC) device comprising:
    (a) a substrate;
    (b) an insulating layer formed on the substrate;
    (c) a buried layer formed on the insulating layer;
    (d) an epitaxial layer of a first conductivity type formed on the buried layer;
    (e) a first isolation trench formed in the epitaxial layer and the buried layer that extends to the insulating layer and that surrounds a first selected surface areas of the epitaxial layer, wherein the first isolation trench comprises a plurality it of first isolation chambers;

(f) a second isolation trench formed in the epitaxial layer and the buried layer that extends to the insulating layer and that surrounds the first isolation trench and defines a guard ring region between itself and the first isolation trench, wherein the second isolation trench comprises a plurality of second isolation chambers;

(g) a collector implanted into the epitaxial layer in the guard ring region;

(h) a contact made to the collector; and (i) a conductor connecting the contact to a ground node.

13. A semiconductor IC device in accordance with claim 12, wherein the ground node comprises an RF ground node.

14. A semiconductor IC device in accordance with claim 12, further comprising:

(a) a first active semiconductor element formed in the epitaxial layer in the first selected surface area.

15. A semiconductor IC device in accordance with claim 14, wherein the first active semiconductor element comprises a transistor.

16. A semiconductor IC device in accordance with claim 12, wherein the buried layer comprises an N conductivity type material.

17. A semiconductor IC device in accordance with claim 12, wherein the collector comprises an N conductivity type material.

18. A semiconductor IC device in accordance with claim 12, wherein the plurality of first and second isolation chambers are square-shaped and have a two-row asymmetrical configuration.

19. A semiconductor integrated circuit (IC) device comprising:

(a) a silicon-on-insulator (SOI) substrate having an insulating layer formed on a substrate;

(b) a guard ring formed on a surfaced of the insulating layer which surrounds a first selected surface area of the insulating layer, the guard ring having a lower buried layer region in contact with the surface of the insulating layer and an upper collector region;

(c) a first and second isolation trenches having a plurality of isolation chambers formed substantially perpendicular to and in contact with the surface of the insulating layer which sandwich and isolate the guard ring therebetween;

(d) a contact made to the upper collector region of the guard ring; and (e) a conductor connecting the contact to a ground node.

20. A semiconductor IC device in accordance with claim 19, further comprising:

(a) a buried layer formed on the first selected surface area of the insulting layer; and (b) an epitaxial layer of a first conductivity type formed on the buried layer.

21. A semiconductor IC device in accordance with claim 20, further comprising a first active semiconductor element formed in the first semiconductor layer.

22. A semiconductor IC device in accordance with claim 21, wherein the first active semiconductor element comprises a transistor.

23. A semiconductor IC device in accordance with claim 19, wherein the lower buried layer region comprises an N conductivity type material.

24. A semiconductor IC device in accordance with claim 19, wherein the upper collector region comprises an N conductivity type material.

25. A semiconductor IC device in accordance with claim 19, wherein the plurality of isolation chambers are square-shaped and have a two-row asymmetrical configuration.

26. A semiconductor IC device in accordance with claim 1, wherein the non-conductive material is silicon oxide.

27. A semiconductor IC device in accordance with claim 1, wherein the non-conductive material is oxide/polysilicon.

28. A semiconductor IC device in accordance with claim 1, wherein the conductive material is silicon.

\* \* \* \* \*